Jan. 10, 1956 R. J. HARASEK 2,730,690

PRINTED CIRCUIT CHASSIS AND TUBE CLIP

Filed March 29, 1952 2 Sheets-Sheet 1

INVENTOR.
Richard J. Harasek
BY
Forman L. Mueller
Atty.

PRINTED CIRCUIT CHASSIS AND TUBE CLIP

Filed March 29, 1952 2 Sheets-Sheet 2

INVENTOR.
Richard J. Harasek
BY
Foorman L. Mueller
Atty.

United States Patent Office 2,730,690

Patented Jan. 10, 1956

2,730,690

PRINTED CIRCUIT CHASSIS AND TUBE CLIP

Richard J. Harasek, Chicago, Ill., assignor to Motorola, Inc., Chicago, Ill., a corporation of Illinois Application March 29, 1952, Serial No. 279,420

5 Claims. (Cl. 339—193)

The present invention relates to the manufacture of electrical devices and more particularly to a simplified assembly of a supporting chassis together with fixedly secured and removably secured electrical components that are electrically interconnected thereon.

In the manufacture of electrical devices such as radio and television receivers or the like that are to be mass-produced, one of the more costly factors to be considered is the comparatively large amount of hand work involved in crimping, cutting, and the actual soldering of the electrical connections between the various electrical components, such as resistors, condensers, coils, sockets, etc. In attempting to solve this problem, the so-called printed circuit has been developed by which many of the electrical connections, and even some of the components have been printed, sprayed, or otherwise coated by a variegated design of conductive material on a chassis sheet of insulating material. Nevertheless, prior to the present invention, such printed circuit chassis have not been commercially attractive for the production of relatively large electrical units such as complete radio or television receiver chassis because of the relatively large number of separate electrical components which still must be bonded or connected to various points of the printed circuit, and the added difficulties of connecting plug-in socket contact assemblies to the printed circuit and the other separate electrical components.

It is a principal object of the present invention to provide the combination with an insulating sheet having applied conductor portions on both sides thereof, of facilities and components all assembled together in a radio chassis adapted for automatic or machine soldering of the components thereon.

Another object of the invention is to provide spring contact elements adapted for easy insertion in an apertured insulating sheet by automatic machinery, as well as by hand, and of such a construction as to be firmly anchored upon the sheet.

It is another object of the invention to utilize an insulating sheet having so-called printed circuits on each side thereof, and provide a layout of apertures on such sheet and contact elements therefor for the easy assembly and soldering of the same and other elements therewith into a complete radio chassis, all with the minimum expenditure of hand labor for such assembly.

A still further object of the invention is to provide a radio chassis adapted to a very major degree to automatic machine assembly as against an assembly which to a major degree is by hand labor.

A feature of the invention is the provision of a sheet chassis member of insulating material having coatings of variegated designs of conductive material on both faces thereof together with apertures extending through the sheet chassis member for assembly thereon of contact elements and chassis components, various of said apertures having conductive material thereon forming an electrical connection between the various portions of the variegated conductive designs on both faces of the chassis member, others of said apertures being arranged to receive a self-retaining spring contact member for the extending prongs of plug-in electrical components such as tubes or the like, and still others of said apertures being correlated in position to respective ones of the contact receiving apertures to receive an integral tail portion of the spring contact together with electrical leads from various separate electrical components, the correlated apertures also intersecting portions of at least one of the conducting coatings on the upper or lower faces of the sheet chassis member for establishing electrical connection therewith.

Another feature of the invention is the novel form of spring contact member which is self-retaining in an aperture of a sheet chassis or the like, and comprises a body portion arranged to overlie the upper face surface of the sheet chassis and having an aperture therethrough in registry with the contact member receiving aperture of the chassis together with a pair of oppostiely positioned depending spring jaws adapted to extend through the chassis aperture, each of the spring jaws having projections to abut the underface surface of the chassis sheet and retain the contact in the chassis aperture after insertion, the body portion also including a downwardly bent end section to contact the upper face of the chassis and constrain the projections against the undersurface of the chassis.

Yet another feature of the invention is the novel combined arrangement of a printed-circuit-sheet chassis of insulating material and prong-receiving spring contact members, each contact member having an integral tail portion extending into a correlated aperture of the chassis, which is substantially larger than the cross-sectional dimensions of the contact tail portion member to permit the additional insertion of wire leads for connecting various separate electrical components thereto. With such an arragement, the various separate electrical components for either side of the chassis sheet may all be mounted in place and electrical connections approximated by insertion of the wire leads in the appropriate correlated apertures without any crimping or tying prior to a soldering operation which may, if desired, be done substantially simultaneously for all connections on one or the other side of the chassis. Thus, a considerable saving in labor time is achieved, which together with the time saved by the use of printed circuits on the insulated chassis sheet for many of the required electrical connections provides for a commercially attractive electrical assembly for mass production.

Further objects, features, and the attending adavntages of the invention will be apparent from the following specification taken with the drawings, in which.

In practicing the invention with the use of automatic machinery to accomplish a large part of the assembly of an electrical chassis, a sheet chassis member of insulating material is punched to form apertures for receiving the mounting lugs of various electrical components to be fixedly secured thereon and to form apertures for receiving the spring contacts necessary to establish connection with the extending prongs of various plug-in components such as tubes or the like. Other correlated apertures are punched in predetermined positions to each of the spring-contact-receiving apertures and are arranged to receive integral tail portions of the spring contacts. Still other apertures are punched to be coated with conductive material and establish electrical connection between various portions of the variegated designs of electrically conductive coatings applied on opposite sides of the chassis sheet for forming electrical connections in a predetermined circuit form. The correlated apertures are substantially larger than the cross-sectional dimensions of the integral tail portions of the spring contacts and provide space for the insertion of wire leads from various separate electrical components to be added to the circuit and chassis. The spring contacts are designed in a novel manner to be self-retaining in the contact receiving apertures of the chassis without the addition of rivets or other securing means and they may be very easily inserted and pressed into place prior to the application of the other separate electrical components and the final soldering steps.

Figure 1:
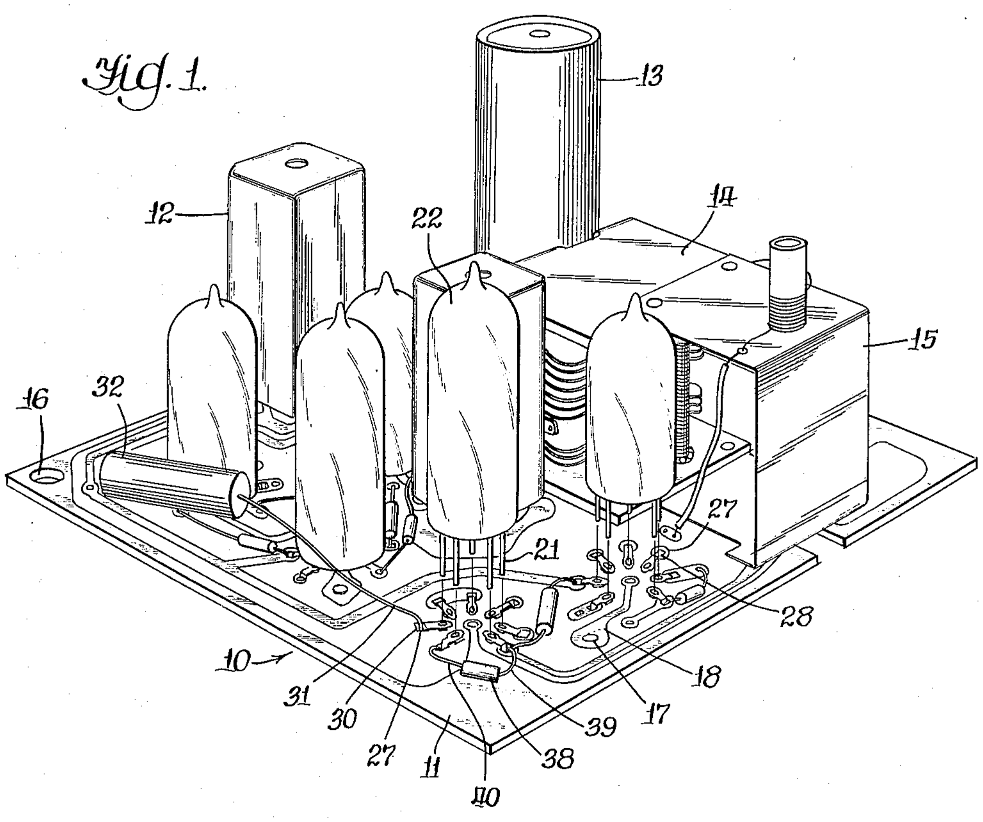
Fig. 1 is a perspective view of a complete radio receiver chassis embodying the features of the invention.

For a more detailed description of the invention, reference is made to Fig. 1 of the drawings wherein the supporting chassis sheet is generally shown at 10. A printed circuit comprising the variegated design of conducting material 11 is coated on the upper face of the chassis. Another printed circuit, which may be of different variegated design, is coated on the underface of the chassis but is not shown in Fig. 1 of the drawing. The sheet chassis 10 is formed of insulating material, preferably a laminated plastic sheet or a molded chassis member having a sheet surface, and is punched prior to the coating or printing of the electrically conductive design on the upper and lower face surfaces. Some of the apertures produced by the punching operation are necessary to receive the mounting lugs of various components, such as the transformer 12, the electrolytic condenser 13, the variable tuning condenser 14, and the antenna coil supporting mount 15. Other apertures, such as the aperture 16 are required for mounting the chassis 10 in a suitable cabinet or the like. Still other apertures, such as shown at 17, are coated with conductive material 18 during the printing operation to establish electrical connection between the conductive coating portion 18 of the variegated design on the upper face of the chassis and another conductive coating portion of the variegated design on the lower face of the chassis not shown. The particular techniques required to produce the conductive coatings of variegated designs on the upper and lower faces and in the apertures of the chassis sheet 10 do not form a part of the present invention and will not be further described, it being understood that any suitable technique for spraying, printing or otherwise coating the conductive material may be used. In fact, for purposes of describing the present invention, "printed circuit" or the like as used herein shall mean the application of conductive material by any of the methods just mentioned.

Figure 3:
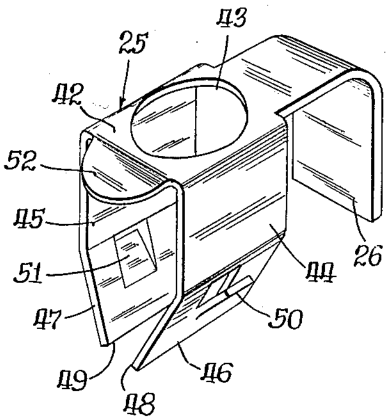
Fig. 3 is a perspective view of the spring contact of the invention.
Figure 2:
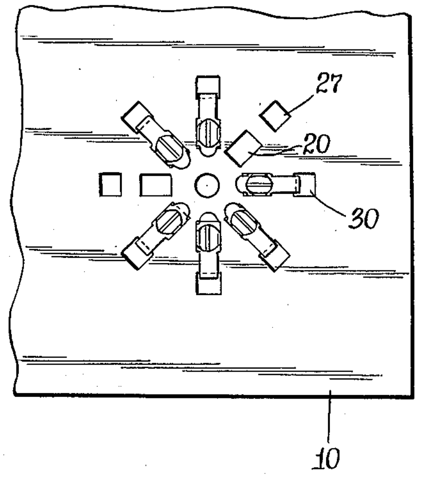
Fig. 2 is a top plan view of the arrangement of spring contacts and chassis apertures.
Figure 4:
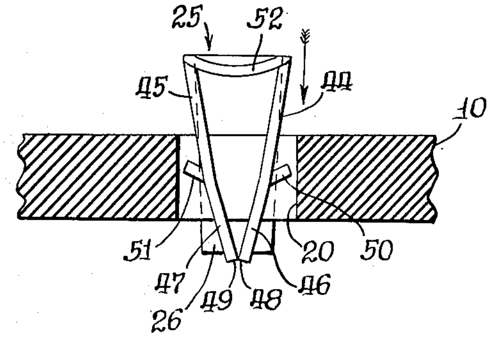
Fig. 4 shows the manner of inserting the spring contact in the chassis aperture.

As more clearly shown in Fig. 2 of the drawings, still other apertures 20 are punched in the chassis sheet 10 and are arranged to receive the extended prongs 21 (Fig. 1) of a removable electrical component such as the vacuum tube 22. In order to establish an electrical connection with the extended prongs 21, electrically conductive spring contact members 25 (Fig. 3) are inserted in the contact receiving aperture 20. The spring contact 25 has an integral depending tail portion 26 which is adapted to extend into a correlated aperture 27 of the chassis member 10. The correlated aperture 27 is located in a predetermined position with relation to a respective one of the contact receiving apertures 20, and as may be seen in Fig. 1 of the drawing, the surface of the chassis in the vicinity of each of the correlated apertures 27 is provided with a portion 28 of the variegated design of electrically conductive material coated thereon. The conductive coating portion 28 extending about the correlated aperture 27 may also extend into the aperture 27 in order to facilitate the formation of an electrical contact with the integral tail portion 26 of the spring contact 25 and in some instances a coating of conductive material may also be applied to the underface surface of the chassis sheet in the vicinity of the correlated aperture 27.

In referring to Figs. 1 and 2 of the drawings, it will be seen that the correlated aperture 27 is substantially larger than the cross-sectional dimensions of the integral tail portion 26 of the spring contact clip 25, thus providing a space 30 for the reception of the wire lead 31 such as for example that lead connecting with a fixed resistor 32 to be added to the printed circuit and radio receiving chassis.

Figure 6:
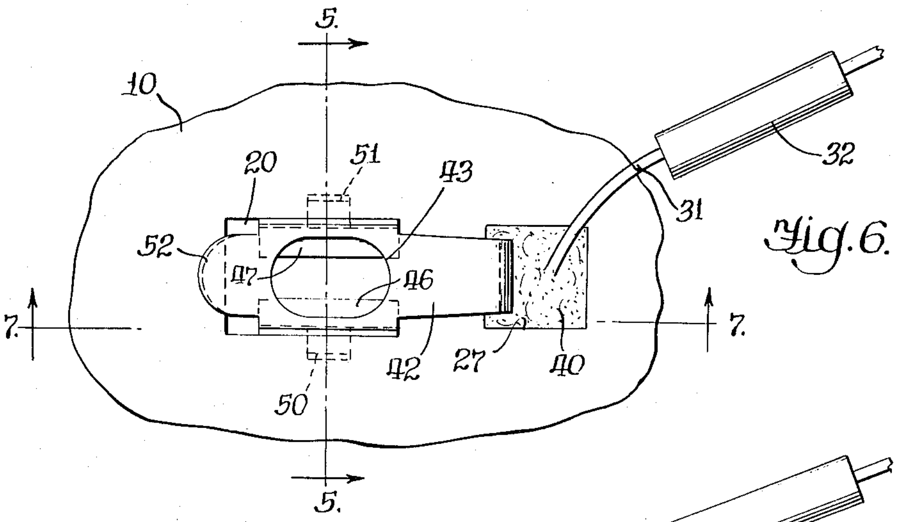
Fig. 6 is a top plan view of the spring contact inserted in a portion of the chassis.
Figure 7:
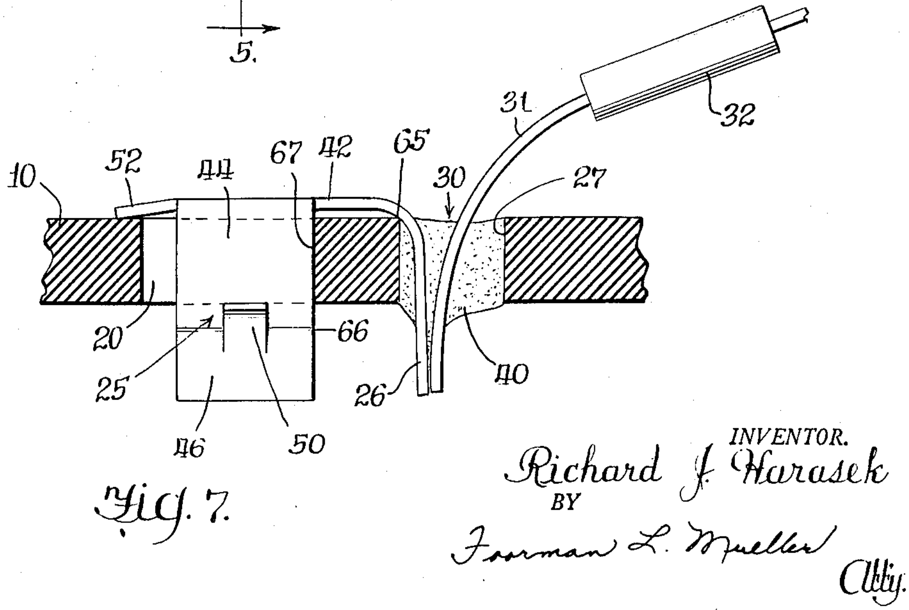
Fig. 7 is a cross-section on the line 7—7 of Fig. 6.

As more clearly shown in Figs. 6 and 7 of the drawings, the wire lead 31 of the fixed resistor 32 is received in the space 30 between the integral tail portion 26 of the spring clip 25 and the walls of the correlated aperture 27. Inasmuch as the wire lead 31, sometimes referred to as a pigtail connection, is of relatively stiff and non-springy material, the pigtail connection of the resistor 32 may be preformed and cut for quick insertion in the assembled relation on the chassis.

As shown in Fig. 1 of the drawings, other electrical components are similarly assembled on the chassis, such as the resistor 38 having the pigtail leads 39 and 40. After all electrical components such as the resistors 32 and 38 for the upper face of the chassis sheet have been assembled with their wire connections inserted in the respective correlated aperture 27, a final electrical bond may be established by soldering as shown at 40 (Figs. 6 and 7 of the drawings). The soldering step may be easily performed in a single operation by applying a suitable soldering tool or the like to the undersurface of the chassis. Thereafter the chassis may be turned over and the separate electrical components to be added to that side of the chassis may be assembled exactly in the same manner as that previously described in connection with the upper face of the chassis. Thereafter the final electrical bond may be established by a soldering operation performed on the lower face of the inverted chassis sheet.

The radio chassis shown in Fig. 1 is a five tube receiver employing miniature tubes of the 7-pin type, i. e. having seven extending prongs for insertion in suitable spring contact elements. In order to facilitate the mass production assembly of each radio receiver, the spring contacts 25 are formed in a novel manner to be self-retaining within the contact receiving apertures 20 of the sheet chassis member 10. As more clearly shown in Figs. 3 to 7 of the drawings, spring contact 25 comprises the upper body portion 42 arranged to overlie the upper face surface of the chassis sheet 10. The body member portion 42 is originally arched slightly, as shown in Fig. 7, for developing a retaining spring tension as will be hereinafter described, and it has an aperture 43 therethrough for receiving the extending prong 21 of the vacuum tube 22 in registry with the contact receiving aperture 20 of the sheet chassis 10. A pair of oppositely positioned depending spring jaw members 44 and 45 are arranged to extend through the contact receiving aperture 20 when the contact is inserted and secured to the sheet chassis 10. The depending spring jaw members 44 and 45 are provided with end portions 46 and 47 which are bent in at an angle towards each other. The jaw surfaces 48 and 49 formed thereby are adapted to grip the extending prong 21 of the tube 22 and establish a secure electrical connection therewith.

Figure 5:
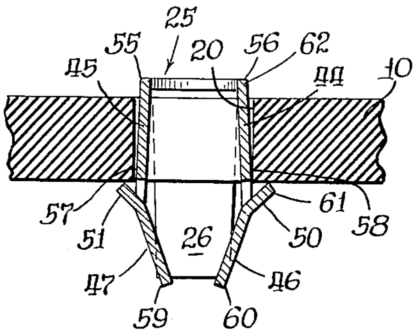
Fig. 5 is a cross-section on the line 5—5 of Fig. 6, which shows a portion of the chassis with spring contact inserted.

Each of the depending spring jaw members 44 and 45 are provided with projections 50 and 51, respectively, which as shown in Fig. 5 of the drawings are arranged to abut the undersurface of the chassis sheet 10 and retain the spring contact 25 after insertion. In order to tightly retain the spring contacts within the contact receiving aperture of the sheet chassis member, the body portion 42 is arched slightly over its length including a downwardly curved end portion 52 arranged to engage the upper surface of the chassis sheet when the contact is inserted. The spring contact 25 is preferably formed entirely of spring material and is indexed relative to the chassis piece 10 from the undersurface so that the projections 50 and 51 may always engage that undersurface as shown in Fig. 5. The arched configuration with the downwardly depending end portion 52 of the body member portion 42 provides the tolerance to accommodate differences in thicknesses in the board 10, and at the same time develop tension when the member is inserted so as to constrain the projections 50 and 51 into contact with the undersurface of the chassis sheet. This firmly positions and retains the spring contact member in the chassis aperture.

In order to further insure that the spring contact 25 will be securely retained in the sheet chassis 10 after insertion and will provide adequate contact pressure with the extending prong 21 of the vacuum tube 22, the angle that such jaw portions 46 and 47 make with respect to the main section of the depending jaw members 44 and 45 and the length of the projections 50 and 51 are all correlated in the manner described as follows. It will be seen in Fig. 4 of the drawings, that during insertion of the spring contact 25 into the contact receiving aperture 20, the jaw surfaces 48 and 49 engage over the end portions of the jaws 46 and 47. In this position the jaws are compressed and the angles between the end portions 46 and 47 and the main jaw body portions 44 and 45 are lessened in order to permit the sliding insertion of the projecting portions 50 and 51 within the aperture 20. To further describe this relationship, the following dimensions are given for the actual production of a spring contact to be used with the presently available miniature type of electron tube. The spring contact is formed of spring brass material having a gauge No. 32 which is approximately a thickness of .008 inch. The contact is to be inserted in the chassis aperture 20 of rectangular shape about .082 inch by .132 inch. The width of the contact body portion 42 between the points 55 and 56 is approximately .08 inch, while the width of the spring contact between the points 57 and 58 is about .09 inch. The width at points 59 and 60 is about .05 inch. The projections 50 and 51 extend for a distance between points 58 and 61 of about .013 inch, and the length of the depending jaw members between points 62 and 58 is about .078 inch, while the length of the jaw members between points 62 and 60 is about .136 inch. It will also be noted that the integral tail portion 26, as shown in Fig. 7 of the drawings engages the top upper surface of the correlated aperture 27 at the point 65 to constrain the back edge 66 of the spring contact 25 into contact with the wall surface 67 of the contact receiving aperture 20. Thus, in such manner the accurate positioning and centering of the spring contact 25 within the contact receiving aperture 20 is assured while at the same time providing a floating or spring action to facilitate insertion of the extending prongs of a miniature tube or the like.

In the foregoing paragraph, suitable dimensions for one embodiment of the spring clip of the invention have been given. It should be understood that the invention is not intended to be limited to these particular dimensions, and that such dimensions have been described only for the purposes of illustrating the manner of correlating various lengths and angles of the depending jaw members and the projections thereof for providing a positive retaining action when the contact clip is inserted in the aperture and correlated aperture of the sheet chassis member.

It is believed apparent from the preceding description that the present invention provides an assembly and contact elements therefor which lends itself to ready production of a radio or other corresponding electrical chassis. The circuit conductor pattern for both sides of an insulating sheet is machine produced, spring contacts are of such a construction as to be machine installed, and after other components may be both hand and machine installed, soldering is done automatically by machine. The result is a simplified, sturdy radio or other electrical circuit chassis which may be produced rapidly and inexpensively with the minimum amount of hand labor.

Various modifications may be made within the spirit of the invention and the scope of the appended claims.

I claim:

1. In a chassis for receiving a removable electrical component of the plug-in type having extending prongs and including a chassis sheet of insulating material having a plurality of prong receiving apertures therethrough together with a plurality of correlated apertures each related in a predetermined position to a respective one of said prong receiving apertures, an electrically conductive prong gripping spring contact inserted in each of said prong receiving apertures comprising, a body portion overlaying the upper face of said chassis sheet and having a prong receiving aperture therethrough in registry with the prong receiving aperture of said sheet, a pair of oppositely positioned spring jaw members depending from said body portion and extending through the prong receiving aperture of said sheet, a tail portion depending from said body portion and extending through the respective correlated aperture of said sheet, each of said jaw members having a projection extending in a direction away from the oppositely positioned jaw member and adapted to contact the lower face surface of said sheet to retain the contact in the respective prong receiving aperture of the sheet, and said body portion having an end portion extending at an angle towards the upper face of said sheet to constrain the projection of each jaw member towards the under surface of said sheet.

2. In a chassis for receiving a removable electrical component of the plug-in type having extending prongs and including a chassis sheet of insulating material having a plurality of prong receiving apertures therethrough together with a plurality of correlated apertures each related in a predetermined position to a respective one of said prong receiving apertures, an electrically conductive prong gripping spring contact inserted in each of said prong receiving apertures comprising, a normally arched body portion overlaying the upper face of said chassis sheet on opposite sides of the prong receiving aperture therein and said body portion having a prong receiving aperture therethrough in registry with the prong receiving aperture of said sheet, a pair of oppositely positioned spring jaw members depending from said body portion and extending through the prong receiving aperture of said sheet, a tail portion depending from said body portion and extending through the respective correlated aperture of said sheet, and each of said jaw members having a projection extending in a direction away from the oppositely positioned jaw member and adapted to contact the lower face surface of said sheet to retain the contact in the respective prong receiving aperture of the sheet against the tension of said normally arched body portion, said tail portion having substantially less cross-sectional dimensions than the area of the correlated aperture through which said tail portion extends to provide space for insertion of wire connections.

3. In a chassis for receiving a removable electrical component of the plug-in type having extending prongs and including a chassis sheet of insulating material having a plurality of prong receiving apertures therethrough together with a plurality of correlated apertures each related in a predetermined position to a respective one of said prong receiving apertures, an electrically conductive prong gripping spring contact inserted in each of said prong receiving apertures comprising, a normally arched body portion overlaying the upper face of said chassis sheet and having a prong receiving aperture therethrough in registry with the prong receiving aperture of said sheet, a pair of oppositely positioned spring jaw members depending from said body portion and extending through the prong receiving apertures of said sheet, a tail portion depending from said body portion and extending through the respective correlated aperture of said sheet, and each of said jaw members having a projection extending in a direction away from the oppositely positioned jaw member and adapted to contact the lower face surface of said sheet to retain the contact in the respective prong receiving aperture of the sheet against the tension of said normally arched body portion, the lower end of each of said jaw members having an extension at an angle in the direction of the opposite jaw member, the degree of angle, the length of said extension, and the length of said projection being correlated such that the ends of said jaw members are abutted and the degree of angle is lessened during insertion of said contact into the prong receiving aperture of said sheet.

4. A prong gripping spring contact adapted to be self retaining in an opening of an insulating panel, said contact including a normally arched body portion having a prong receiving aperture therethrough, a pair of oppositely positioned spring jaw members depending from said body portion on opposite sides of said prong receiving aperture and adapted to grip a prong inserted in such aperture, said body portion having an end portion extending at an angle in the direction of said jaw members, and a pair of projections respectively formed on said jaw members, each of said projections extending in a direction away from the oppositedly positioned jaw member whereby said jaw members may be inserted in the opening with said end portion and said projections engaging opposite sides of the panel to retain said contact.

5. A prong gripping spring contact adapted to be self secured in an apertured panel, said contact comprising a normally arched elongated body portion having a prong receiving aperture therethrough, a pair of spring jaw members respectively depending from the sides of said body portion on opposite sides of said prong receiving aperture and having inwardly inclined end sections, said jaw members being adapted to grip a prong inserted in such aperture, a tail portion depending from one end of said body portion in the direction of said jaw members to provide a connection terminal, the other end of said body portion being inclined in the direction of said jaw members, and a pair of projections respectively formed on said jaw members, each of said projections extending outwardly and inclined toward the plane of said body portion whereby engagement of said panel by said projections and the inclined end of said body portion secures said contact in the panel.

References Cited in the file of this patent

UNITED STATES PATENTS

| | | |
|---|---|---|
| 1,956,376 | Draving | Apr. 24, 1934 |
| 1,992,925 | Lodge | Feb. 26, 1935 |
| 2,032,979 | Fischer | Mar. 3, 1936 |
| 2,352,618 | Daenz | July 4, 1944 |
| 2,474,988 | Sargrove | July 5, 1949 |
| 2,519,121 | Del Camp | Aug. 15, 1950 |
| 2,533,483 | Losquadro | Dec. 12, 1950 |

FOREIGN PATENTS

| | | |
|---|---|---|
| 649,254 | Great Britain | Jan. 24, 1951 |